United States Patent
Adams et al.

(10) Patent No.: US 6,999,132 B1
(45) Date of Patent: Feb. 14, 2006

(54) RF/IF DIGITAL DEMODULATION OF VIDEO AND AUDIO

(75) Inventors: Christopher R. Adams, Saratoga, CA (US); Dean L. Raby, San Diego, CA (US)

(73) Assignee: LSI Logic Corporation, Milpitas, CA (US)

( * ) Notice: Subject to any disclaimer, the term of this patent is extended or adjusted under 35 U.S.C. 154(b) by 578 days.

(21) Appl. No.: 10/079,026

(22) Filed: Feb. 19, 2002

(51) Int. Cl.
*H04N 5/50* (2006.01)

(52) U.S. Cl. ...................... 348/731; 348/554

(58) Field of Classification Search ............... 348/731, 348/725, 726, 554, 180, 194; 725/38, 85, 725/100, 131, 151; 375/316, 340
See application file for complete search history.

(56) References Cited

U.S. PATENT DOCUMENTS

| | | | | |
|---|---|---|---|---|
| 5,440,268 A | * | 8/1995 | Taga et al. .................. 329/308 |
| 5,479,449 A | * | 12/1995 | Patel et al. .................. 375/316 |
| 5,504,785 A | | 4/1996 | Becker et al. .............. 375/344 |
| 5,612,975 A | | 3/1997 | Becker et al. .............. 375/319 |
| 6,243,430 B1 | * | 6/2001 | Mathe .......................... 375/346 |
| 6,359,938 B1 | * | 3/2002 | Keevill et al. ............... 375/316 |
| 6,400,420 B1 | * | 6/2002 | Kim ............................ 348/731 |
| 6,496,229 B1 | * | 12/2002 | Limberg ..................... 348/725 |
| 6,550,063 B1 | * | 4/2003 | Matsuura .................... 725/133 |
| 6,895,232 B1 | * | 5/2005 | Parker ......................... 455/313 |

FOREIGN PATENT DOCUMENTS

EP 913924 A1 * 5/1999

* cited by examiner

Primary Examiner—Victor R. Kostak
(74) Attorney, Agent, or Firm—Christopher P. Maiorana PC

(57) ABSTRACT

An apparatus generally comprising a tuner circuit, an analog-to-digital circuit and a converter circuit. The tuner circuit may be configured to generate an intermediate frequency signal having a carrier signal at a first intermediate frequency in response to a first frequency conversion applied to a radio-frequency signal modulated by an analog television signal. The analog-to-digital circuit may be configured to generate a digital intermediate signal having the carrier signal at a second intermediate frequency in response to a digitization of the intermediate frequency signal. The converter circuit may be configured to generate a digital television signal representative of the analog television signal at a baseband frequency in response to a demodulation of the digital intermediate signal.

21 Claims, 12 Drawing Sheets

RF/IF DIGITAL DEMODULATION OF VIDEO AND AUDIO

FIELD OF THE INVENTION

The present invention relates to a method and/or architecture for demodulating a radio-frequency signal modulated by an analog television signal generally and, more particularly, to an apparatus and method for generating a digital television signal at a baseband frequency by digitizing an intermediate frequency signal generated from the radio-frequency signal.

BACKGROUND OF THE INVENTION

A conventional set-top box (STB) is used to convert an analog television signal within a radio-frequency (RF) carrier to a baseband frequency suitable for use by other conventional items such as televisions, video tape recorders and audio equipment. The STB accomplishes the RF-to-baseband conversion as a series of smaller conversions. The RF carrier is first frequency converted to an intermediate frequency signal. The intermediate frequency signal is then demodulated to produce the analog television signal at baseband. The analog television signal is filtered to separate a baseband video signal and a modulated audio signal. The modulated audio signal is demodulated to extract a baseband audio signal in an analog domain for presentation external to the STB.

The STBs commonly perform enhancement processing of the baseband video and audio signals. For example, graphic overlays are provided in the video signal and sound quality adjustments are made to the audio signal. The enhancement processing is conventionally performed in a digital domain using a digital signal processor. The baseband audio and video signals are digitized, processed, and then converted back to the analog domain for presentation. The result is a significant amount of analog circuitry in the STB to transform the RF carrier to a digitized video signal and a digitized audio signal prior to the enhancement processing.

SUMMARY OF THE INVENTION

The present invention concerns an apparatus generally comprising a tuner circuit, an analog-to-digital circuit and a converter circuit. The tuner circuit may be configured to generate an intermediate frequency signal having a carrier signal at a first intermediate frequency in response to a first frequency conversion applied to a radio-frequency signal modulated by an analog television signal. The analog-to-digital circuit may be configured to generate a digital intermediate signal having the carrier signal at a second intermediate frequency in response to a digitization of the intermediate frequency signal. The converter circuit may be configured to generate a digital television signal representative of the analog television signal at a baseband frequency in response to a demodulation of the digital intermediate signal.

The objects, features and advantages of the present invention include providing a method and an apparatus than that may (i) convert an intermediate frequency signal to a baseband signal, (ii) present the baseband signal in a digital format, (iii) reduce circuit cost and complexity to produce the digitized baseband signal and/or (iv) minimize the introduction of noise in converting to the digitized baseband signal.

BRIEF DESCRIPTION OF THE DRAWINGS

These and other objects, features and advantages of the present invention will be apparent from the following detailed description and the appended claims and drawings in which:

FIG. 9 is a functional block diagram of the tracking detector circuit;

DETAILED DESCRIPTION OF THE PREFERRED EMBODIMENTS

Figure 1:
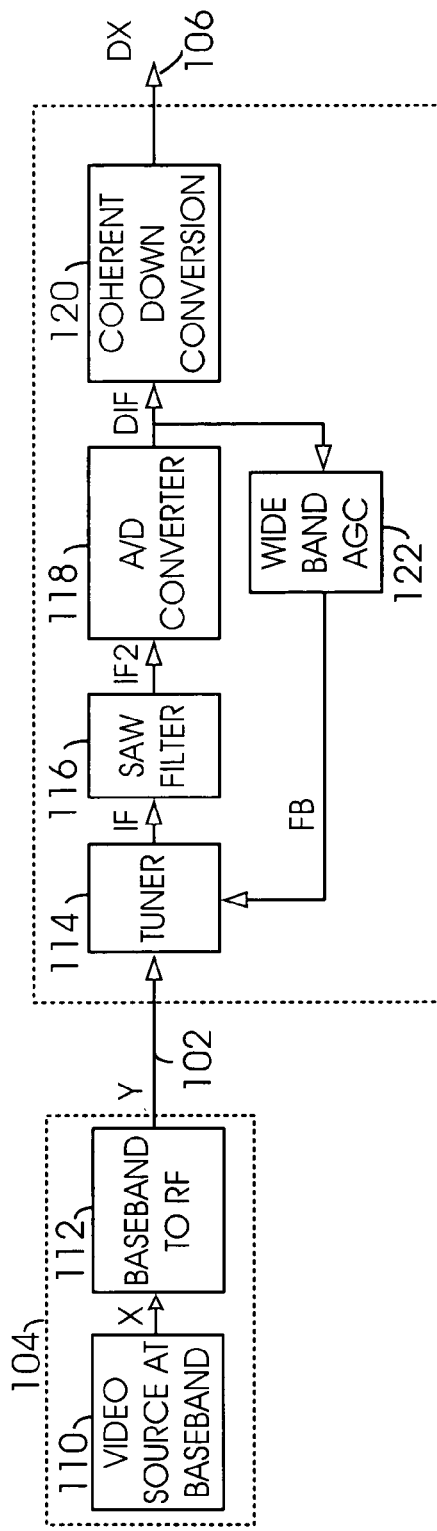
FIG. 1 is a block diagram of an apparatus in accordance with a preferred embodiment of the present invention.

Referring to FIG. 1, a block diagram of an apparatus 100 is shown in accordance with a preferred embodiment of the present invention. An input 102 may be provided in the apparatus 100 to receive a signal (e.g., Y) from an RF source 104. An output 106 may be provided in the apparatus 100 to present a signal (e.g., DX).

The RF source 104 may generate a signal (e.g., X) at a baseband frequency. The RF source 104 may then use the signal X to modulate a radio-frequency (RF) carrier. The modulated RF carrier may be presented to the apparatus 100 as the signal Y. The apparatus 100 may be configured to convert the signal Y to the signal DX representative of the signal X.

The signal X may be implemented as an analog television signal. The analog television signal X may vary as a function of time (e.g., X(t)). The analog television signal X generally comprises a video signal and an audio carrier modulated by an audio signal. The analog television signal X may comply with the National Television System Committee (NTSC) standard, Phase Alternate Line (PAL) standard, and Sequential Couleur Avec Mémoire (SECAM) standard. Compliance with other standards may be provided within the present invention to meet the design criteria of a particular implementation.

Figure 2:
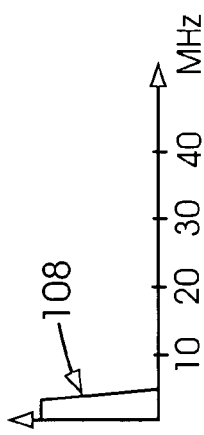
FIG. 2 is a graph of a frequency response of an analog television signal at baseband.

Referring to FIG. 2, a graph of a frequency response 108 of the analog television signal X is shown. The frequency response may be representative of the analog television signal X in compliance with the NTSC standard. Frequency responses for the PAL standard and the SECAM standard may be similar. In an NTSC compliant system, the analog television signal X generally has a bandwidth of 6 MHz.

Referring back to FIG. 1, the signal Y may be implemented as a radio-frequency signal. The RF signal Y may vary as a function of time (e.g., Y(t)). The signal Y may modulated by the analog television signal X.

The signal DX may be implemented as a digital television signal. The digital television signal DX may vary in time (e.g., DX(t)). The digital television signal DX may represent the analog television signal X in digital form.

The RF source 104 generally comprises a video source circuit 110 and a modulator circuit 112. The video source circuit 110 may be configured to generate and present the analog television signal X. The modulator circuit 112 may be configured to generate and present the RF signal Y as a function of the analog television signal X.

The apparatus 100 generally comprises a tuner circuit 114, a filter circuit 116, a converter circuit 118, a second converter circuit 120, and an automatic gain control circuit 122. The tuner circuit 114 may provide the input 102 to receive the RF signal Y. The second converter circuit 120 may provide the output 106 to present the digital television signal DX.

A signal (e.g., IF) may be generated and presented by the tuner circuit 114 to the filter circuit 116. Another signal (e.g., IF2) may be generated and presented by the filter circuit 116 to the converter circuit 118. The converter circuit 118 may generate a signal (e.g., DIF) and present the signal DIF simultaneously to the second converter circuit 120 and the automatic gain control circuit 122. The automatic gain control circuit 122 may generate and present a signal (e.g., FB) to the tuner circuit 114.

Figure 3:
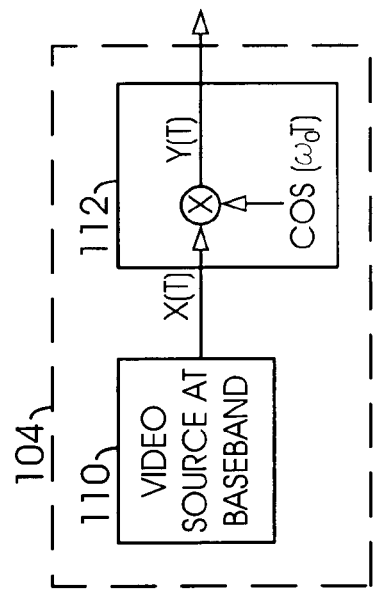
FIG. 3 is a functional block diagram of an radio-frequency circuit.

Referring to FIG. 3, a functional block diagram of the RF circuit 104 is shown. The video source circuit 110 may generate the analog television signal X. A sinusoidal carrier signal (e.g., $\cos(\omega_o t)$) generated within the modulator circuit 112 may be modulated by the analog television signal X to produce the RF signal Y. The modulation may be according to equation 1 as follows:

$$Y(t)=X(t)\cos(\omega_o t) \quad \text{Eq. (1)}$$

The tuner circuit 114 generally converts or translates the RF signal Y to the signal IF. In a PAL compliant system, the signal IF may be implemented as an intermediate frequency signal with a carrier at a frequency (e.g., $\omega_v$) of 36 MHz. In the NTSC system, the signal IF may be implemented as an intermediate frequency signal with the carrier at a frequency $\omega_v$ of 44 MHz. The intermediate frequency signal IF may be expressed by equation 2 as follows:

$$IF(t)=X(t)\cos(\omega_v t) \quad \text{Eq. (2)}$$

The filter circuit 116 may be implemented as a surface acoustic wave (SAW) filter. The SAW filter circuit 116 may be configured to have passband characteristic that suppresses noise outside the band to reduce the level of alias components that fall within the Nyquist interval from the conversion processes. The passband of the SAW filter circuit 116 is generally centered at a modulated carrier frequency of the intermediate frequency signal IF. In particular, the passband may be centered at a frequency of 36 MHz for the PAL system and 44 MHz for the NTSC system. The filtered intermediate frequency signal IF may be presented by the SAW filter circuit 116 as the signal IF2.

The converter circuit 118 may be implemented as an analog-to-digital (A/D) converter circuit with a polyphase filter for time position locking. The A/D converter circuit 118 generally converts each input sample of the signal IF2 to a 10-bit value at a sampling rate. Other conversion values may be implemented to meet the design criteria of a particular application. The basic structure and operation of polyphase filters is commonly known. See for example U.S. Pat. No. 5,504,785 issued to Becker et al., hereby incorporated by reference in its entirety. The A/D converter circuit 118 generally transforms the signal IF2 from an analog domain to a digital domain as shown in equation 3 as follows:

$$DIF(n)=X(n)\cos(\omega_c n) \quad \text{Eq. (3)}$$

The variable n may be a discrete sample in time. The variable $\omega_c$ is generally defined in equation 4 as follows:

$$\omega_c=2\pi Fs/Fc \quad \text{Eq. (4)}$$

The frequency Fs may be the sampling frequency of the A/D converter circuit 118 in units of cycles per second. The frequency Fc may be the intermediate frequency in units of cycles per second.

A relationship between an upper and a lower video carrier and an upper and a lower picture carrier processed by the A/D converter circuit 118 generally depends upon a mode of operation for the apparatus 100. For the PAL system, the A/D converter circuit 118 may operate at a sampling rate of 27 million samples per second. Therefore, the Nyquist interval generally extends from −13.5 MHz to 13.5 MHz. In the NTSC system, the A/D converter circuit 118 may operate at the sampling rate of 54 million samples per second. Therefore, the Nyquist interval generally extends from −27 MHz to 27 MHz.

Figure 4A:
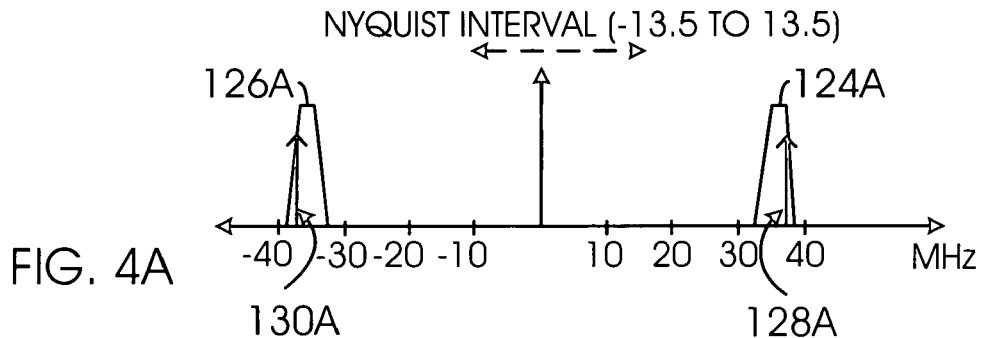
FIG. 4 is a frequency response at an A/D converter circuit for a PAL system.
Figure 4B:
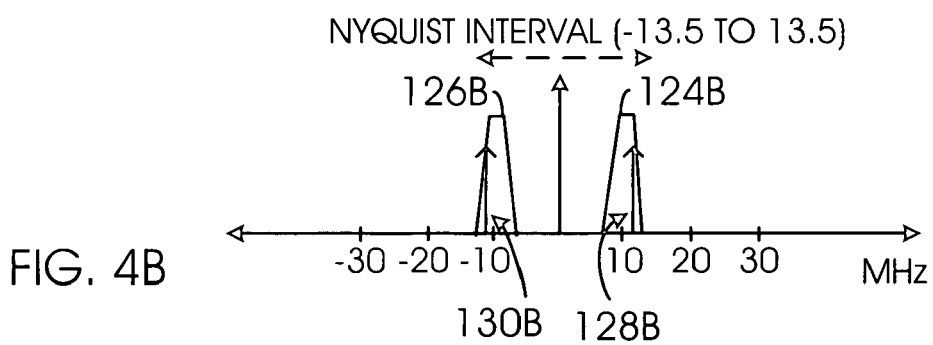

Referring to FIG. 4, a frequency response at an input to the A/D converter circuit 118 (FIG. 4A) and another frequency response at an output of the A/D converter circuit 118 (FIG. 4B) are shown for the PAL system. Alias components 124B of the 36 MHz video carrier 124A generally translate to 9 MHz at the output of the A/D converter circuit 118. Similarly, the alias components 126B of the −36 MHz video carrier 126A generally translate to −9 MHz. Suppressed picture carriers 128A–B and 130A–B are shown only to illustrate the relationship between the upper carriers 128 and the lower carriers 130 at the input and the output of the A/D converter circuit 118. For the PAL system, a relationship between the video carriers 124A/126A and the picture carriers 128A/130A at the input of the A/D converter circuit 118 may not change as compared to the video carriers 124B/126B and the picture carriers 128B/130B at the output of the A/D converter circuit 118. In both cases the positive picture carrier 128 is located on the upper side of the positive video carrier 124.

Figure 5A:
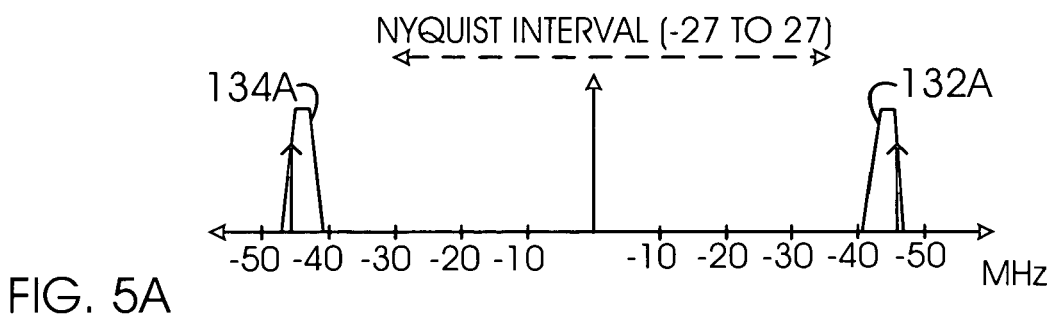
FIG. 5 is a frequency response at the A/D converter circuit for an NTSC system.
Figure 5B:
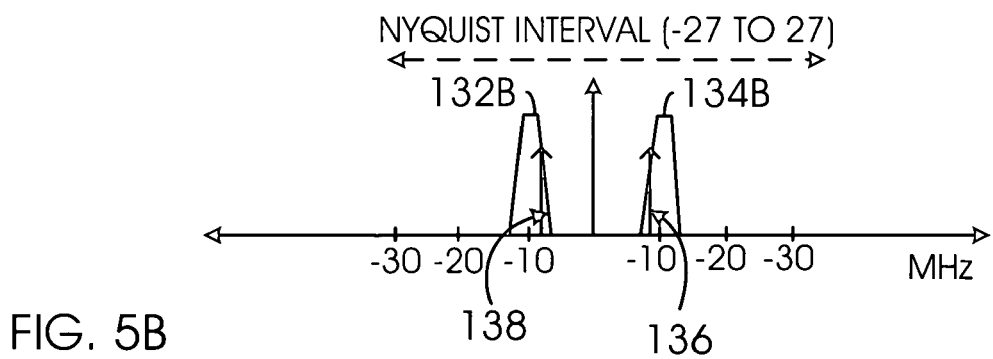

Referring to FIG. 5, a frequency response at an input to the A/D converter circuit 118 (FIG. 5A) and another frequency response at an output of the A/D converter circuit 118 (FIG. 5B) are shown for the NTSC system. The video carrier may now be located at the intermediate frequency of 44 MHz. FIG. 5B generally shows the effect of aliasing through the A/D converter circuit 118. A positive video carrier 132A at 44 MHz in the signal IF2 may translate to a negative video carrier 132B at −10 MHz in the signal DIF.

A negative video carrier 134A at −44 MHz in the signal IF2 may translate to a positive video carrier 134B at 10 MHz in the signal DIF. At the output of the A/D converter circuit 118, a positive picture carrier 136 is generally located on a lower side of the positive video carrier 134A. The signal DIF may be real, and hence symmetric about the zero frequency and therefore a negative picture carrier 138 may located on upper side of the negative video carrier 132B.

Figure 6:
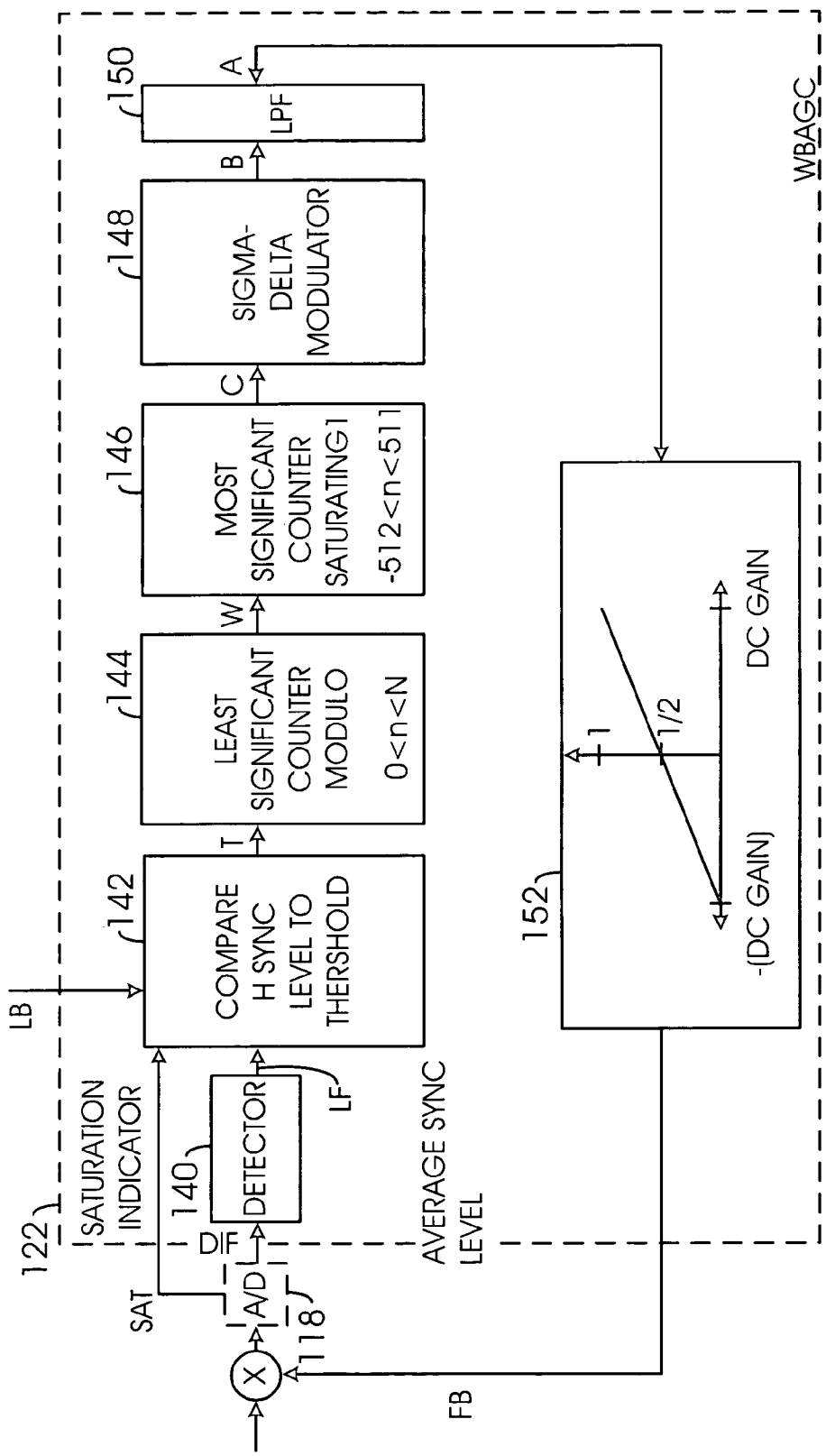
FIG. 6 is a block diagram of an automatic gain control circuit.

Referring to FIG. 6, a block diagram of the automatic gain control circuit 122 is shown. The automatic gain control circuit 122 may be implemented as a wide band automatic gain control (WBAGC) circuit. The WBAGC circuit 122 generally comprises a detector circuit 140, a compare circuit 142, a first counter circuit 144, a second counter circuit 146, a modulator circuit 148, a filter circuit 150, and a gain circuit 152. The WBAGC circuit 122 may be configured to (i) detect a saturation of the A/D converter circuit 118 to reduce a likelihood of saturation, (ii) estimate a position and an average level of a horizontal synchronization pulses within the signal DIF, and (iii) provide a gain adjustment of the average horizontal synchronization pulse level at an output of the A/D converter circuit 118 to maximize use of a dynamic range of the A/D converter circuit 118.

The detector circuit 140 may be configured to estimate the position and the average level of the horizontal synchronization pulses within the signal DIF. The compare circuit 142 may be configured to compare the average horizontal synchronization pulse level with a threshold. The first counter circuit 144 may be configured as a modulo type least significant counter circuit. The second counter circuit 146 may be configured as a saturating type most significant counter circuit. The modulator circuit 148 may be implemented as a sigma-delta modulator circuit. The filter circuit 150 may be implemented as a loop filter circuit. The gain circuit 152 may be configured as a linear gain and multiplier circuit.

Figure 11A:
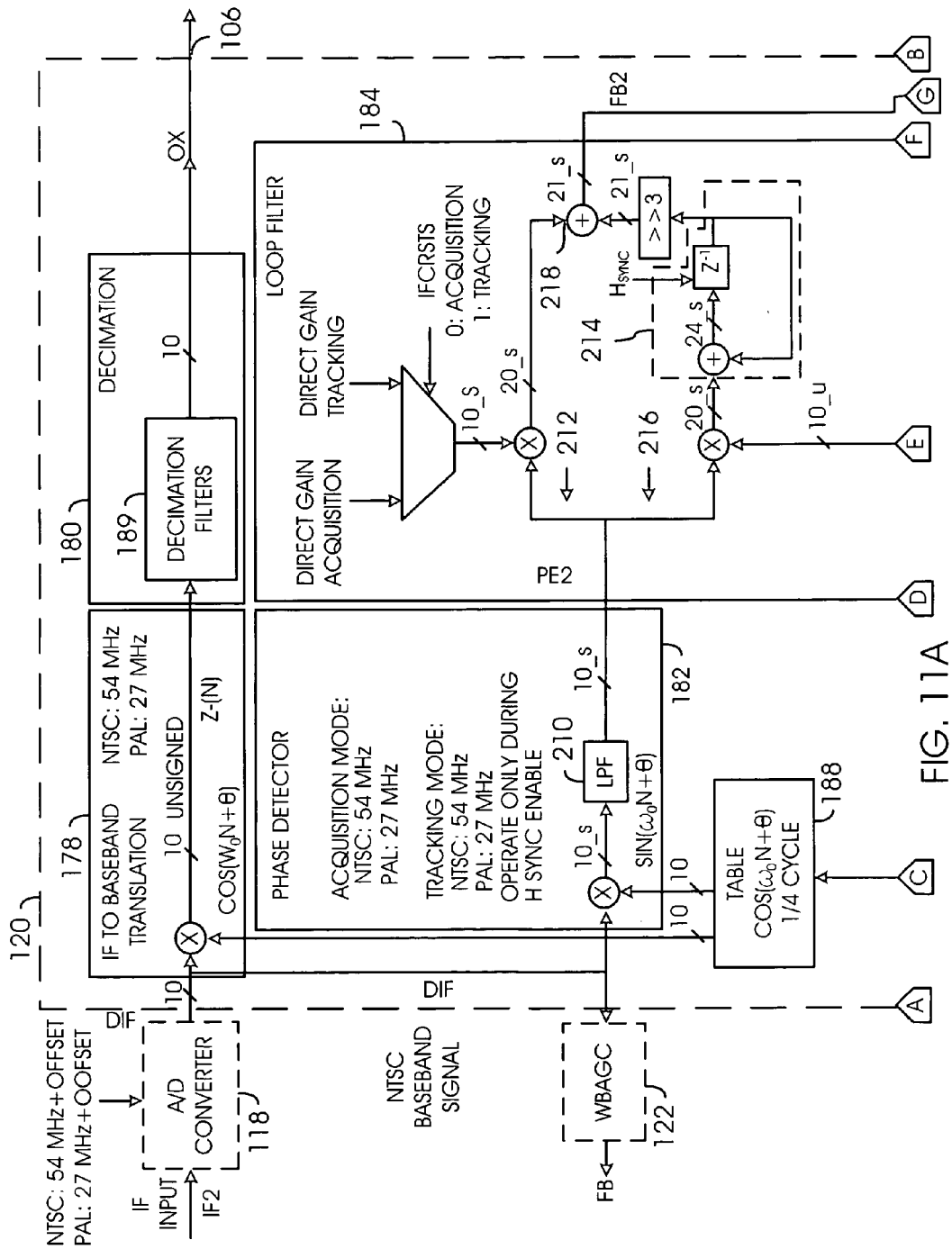
FIG. 11 is a functional block diagram of a converter circuit.
Figure 11B:
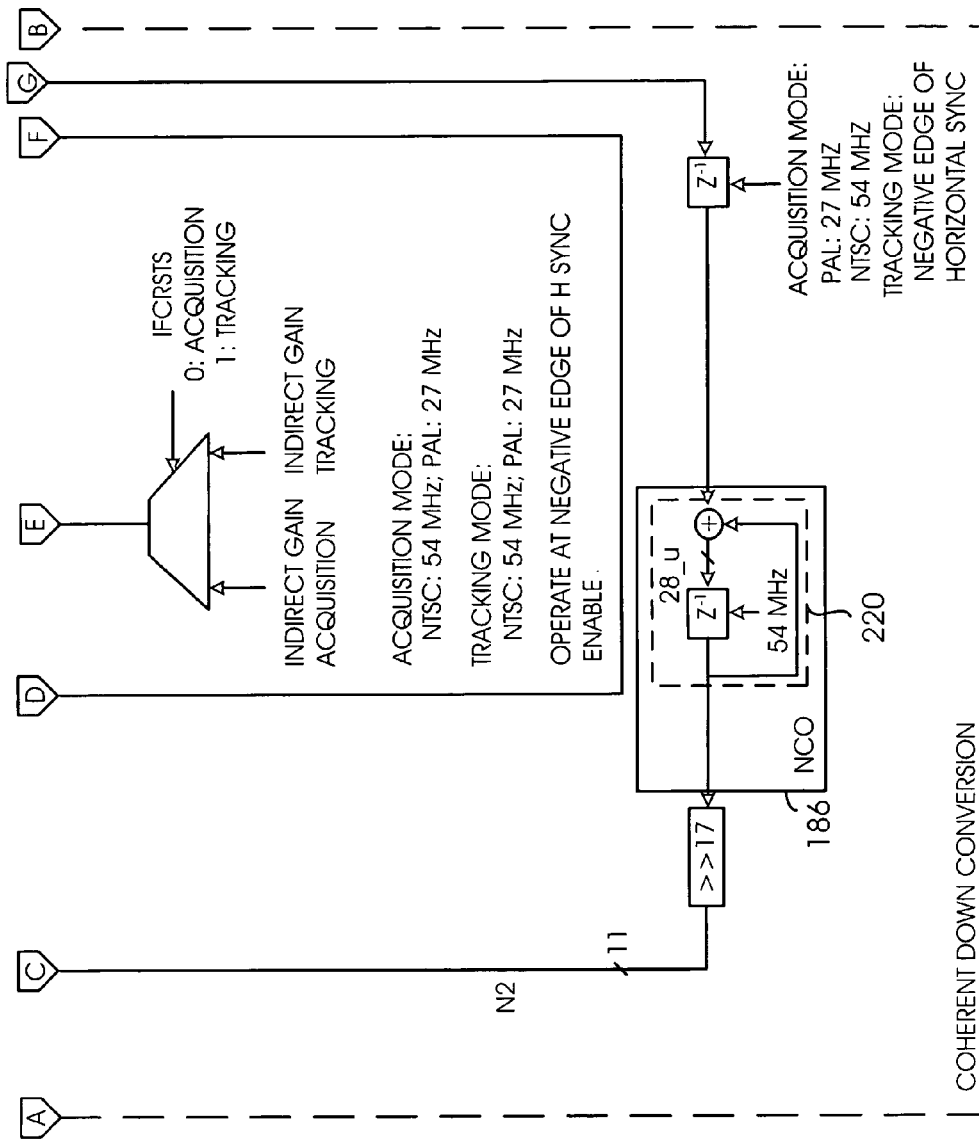

In an acquisition mode, the detector circuit 140 may estimate the average peak level of the horizontal synchronization pulses for use by the compare circuit 142. A signal (e.g., LF) may convey the average peak level from the detector circuit 140 forward to the compare circuit 142. In a tracking mode, the compare circuit 142 may take the level of the horizontal synchronization pulses from a decimation filter circuit (FIG. 11). A signal (e.g., LB) may convey the average level from a decimation filter circuit 189 (FIG. 16) back to the compare circuit 142. The compare circuit 142 may generate and present a signal (e.g., T) to the least significant counter circuit 144 indicating the results of the threshold comparison, In both the acquisition and the tracking mode the average peak level applies to the WBAGC circuit 122.

When the average level of the horizontal synchronization pulses is less than the threshold (e.g., the signal T is in a first logical state), then the least significant counter circuit 144 may increment. Conversely, when the average level is greater than the threshold (e.g., the signal T is in a second logical state), the least significant counter circuit 142 may decrement. A signal (e.g., SAT) from the A/D converter circuit 118 that indicates a saturation condition in the A/D converter circuit 118 generally overrides the detector circuit 140. Therefore, if the A/D converter circuit 118 saturates at any time during a horizontal synchronization period, then the least significant counter circuit 142 may decrement regardless of the signal T. The WBAGC circuit 122 generally operates at a horizontal synchronization rate of the analog television signal X.

The least significant counter circuit 142 may count in modulo N. A signal (e.g., W) may be generated in an increasing state and presented by the least significant counter circuit 142 when a count increments (wraps around) from the value N to a zero value. The most significant counter circuit 146 may respond to the wrap signal W in the increasing state by incrementing a second count by one (1). Likewise, when the least significant counter circuit 142 decrements (wraps around) the count from the zero value to the value N then the wrap signal W may be generated in a decreasing state. The most significant counter circuit 144 may respond to the wrap signal W in the decreasing state by decrementing the second count by one (1). The most significant counter circuit 146 may be implemented as a saturating type counter that will not increment over a maximum positive value or decrement under a maximum negative value. A signal (e.g., C) representing the second count may be presented by the most significant counter circuit 146 to the sigma-delta modulator circuit 148. The count signal C may be implemented as a 10-bit digital signal.

A general purpose of the sigma-delta modulator circuit 148 and the loop filter circuit 150 is to convert the count signal C to an analog signal (e.g., A). The sigma-delta modulator circuit 148 may convert the 10-bit count signal C to a 1-bit signal (e.g., B). The loop filter circuit 150 may be implemented as an analog filter external to an application specific integrated circuit used to implement the rest of the apparatus 100. The loop filter circuit 150 may filter the 1-bit signal B to generate the analog signal A. The linear gain and multiplier circuit 152 may normalize the analog signal A to generate the feedback signal FB. The feedback signal FB may be generated at (i) a maximum normalized value (e.g., unity) when the analog signal A has a maximum positive value and (ii) at a minimum normalized value (e.g., null) when the analog signal A has a maximum negative value.

Figure 7:
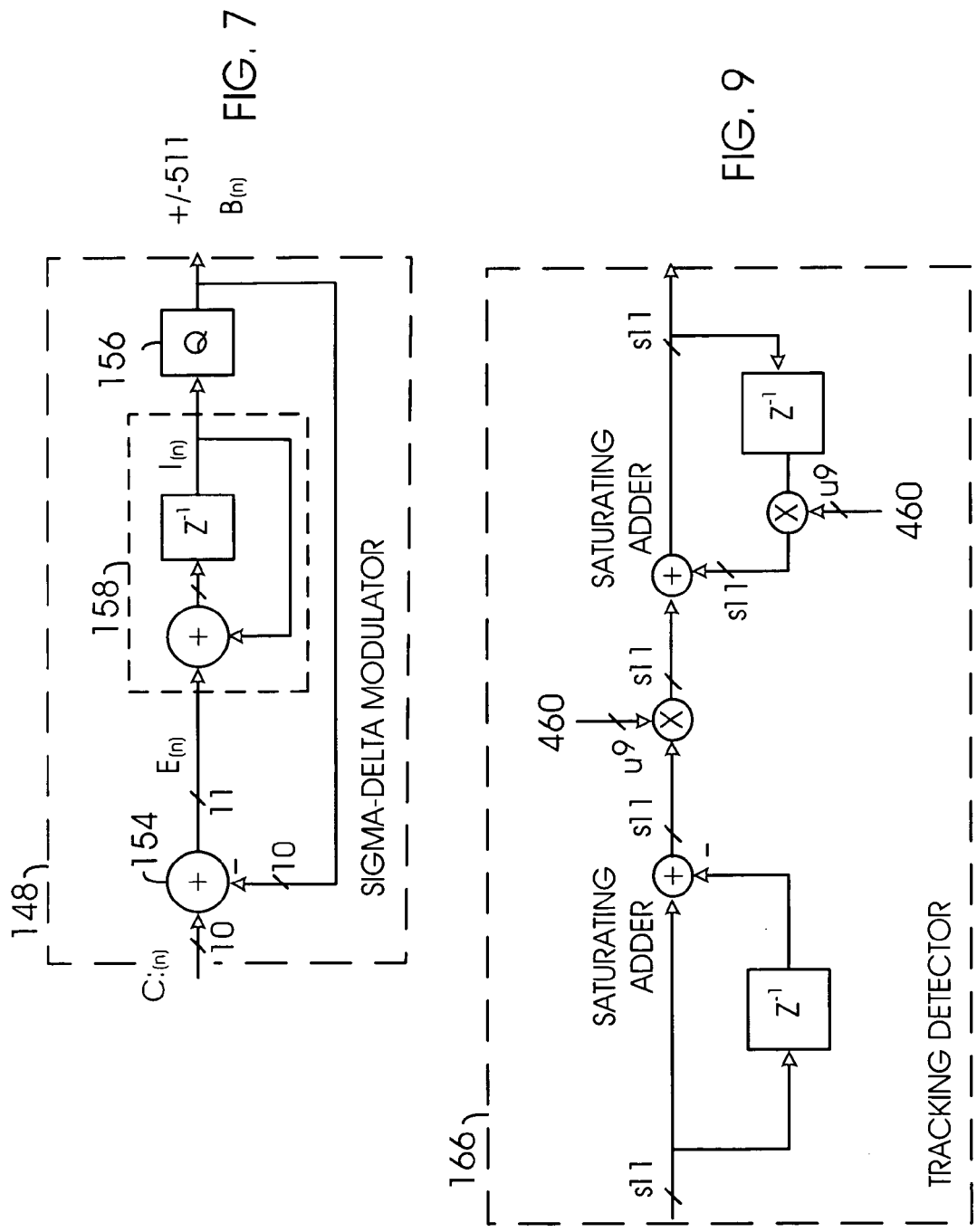
FIG. 7 is a functional block diagram of a sigma-delta modulator circuit.

Referring to FIG. 7, a functional block diagram of the sigma-delta modulator circuit 148 is shown. The received count signal C(n) may be represented by ten (10) bits and is processed by a closed loop circuit. An input summing junction 154 may generate an error signal (e.g., E(n)) between the count signal C(n) and the signal B(n) generated by a quantizer 156. The error signal E(n) may then be accumulated in an integrator 158. A signal (e.g., I(n)) generated by the integrator 158 may then be quantized to one of two 10-bit values (e.g., +511 or −511) by the quantizer 156 and feed back to the input summing junction 154. The resulting negative feedback and accumulation of the error signal E(n) in the integrator 158 generally forces the average value of the 1-bit signal B(n) to track the 10-bit signal C(n).

Figure 8:
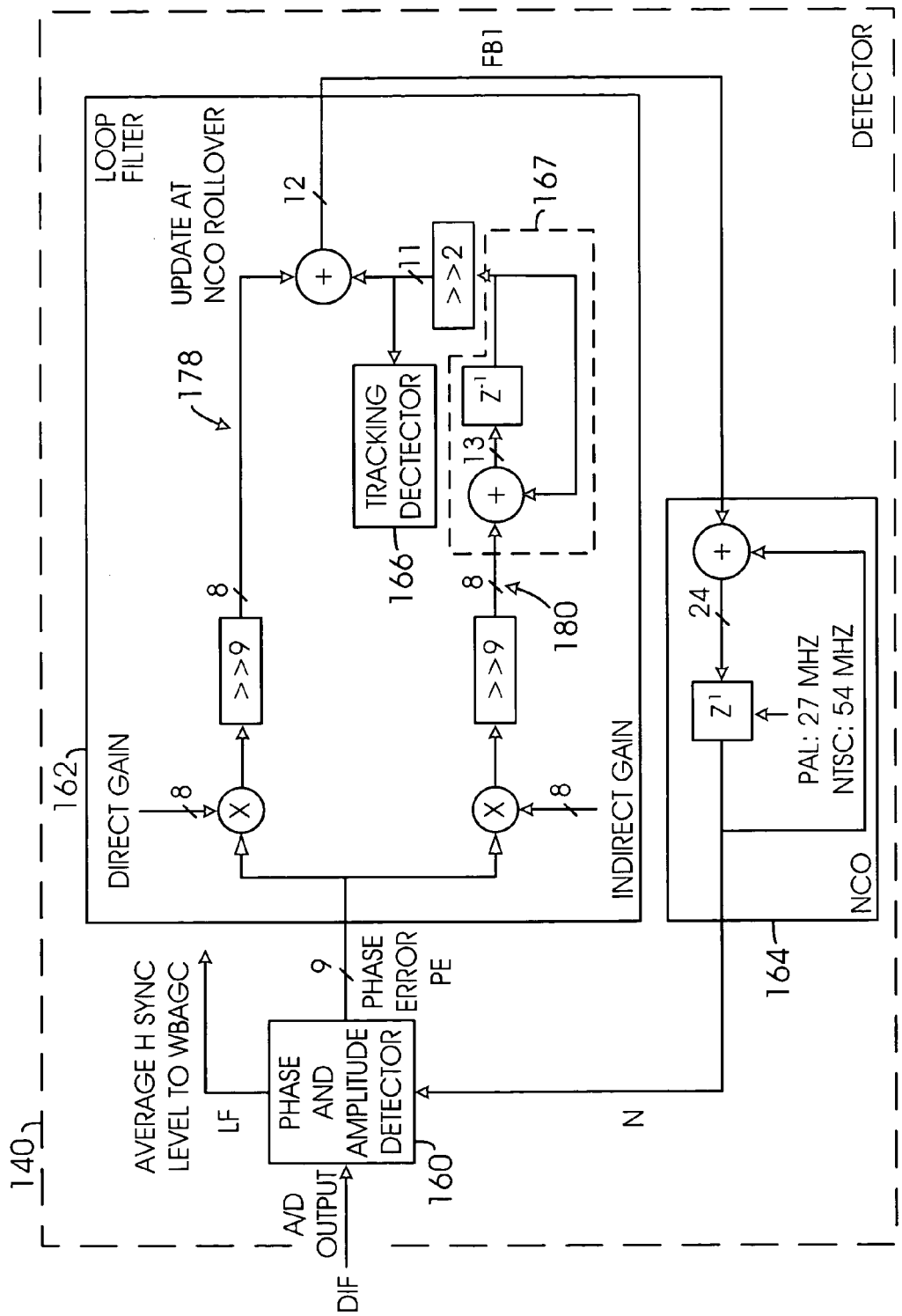
FIG. 8 is a functional block diagram of a detector circuit.

Referring to FIG. 8, a functional block diagram of the detector circuit 140 is shown. A general purpose of the detector circuit 140 may be to track the position of the horizontal synchronization pulses and estimate the average level of the horizontal synchronization pulses. The detector circuit 140 generally comprises a phase and amplitude detector circuit 160, a loop filter 162, and a numerically controlled oscillator (NCO) circuit 164. The loop filter 162 may include a tracking detector circuit 166.

The phase and amplitude detector circuit 160 may measure a phase difference between a rollover of a signal (e.g., N) generated by the NCO circuit 164 and a positive edge of each horizontal synchronization pulse within the digital signal DIF. In addition, the phase and amplitude detector circuit 160 may estimate the average level of the horizontal synchronization pulses. A phase error signal (e.g., PE) may be applied to the loop filter 162 and the average level signal LF may be applied to the compare circuit 142 (FIG. 6).

Referring to FIG. 9, a functional block diagram of the tracking detector circuit 166 is shown. The tracking detector circuit 166 generally receives a signal from a frequency accumulator 167 to determine if the frequency accumulator 167 has reached steady state. The tracking detector circuit 166 may generate a horizontal synchronization enable signal (e.g., H_SYNC_ENABLE).

Figure 10:
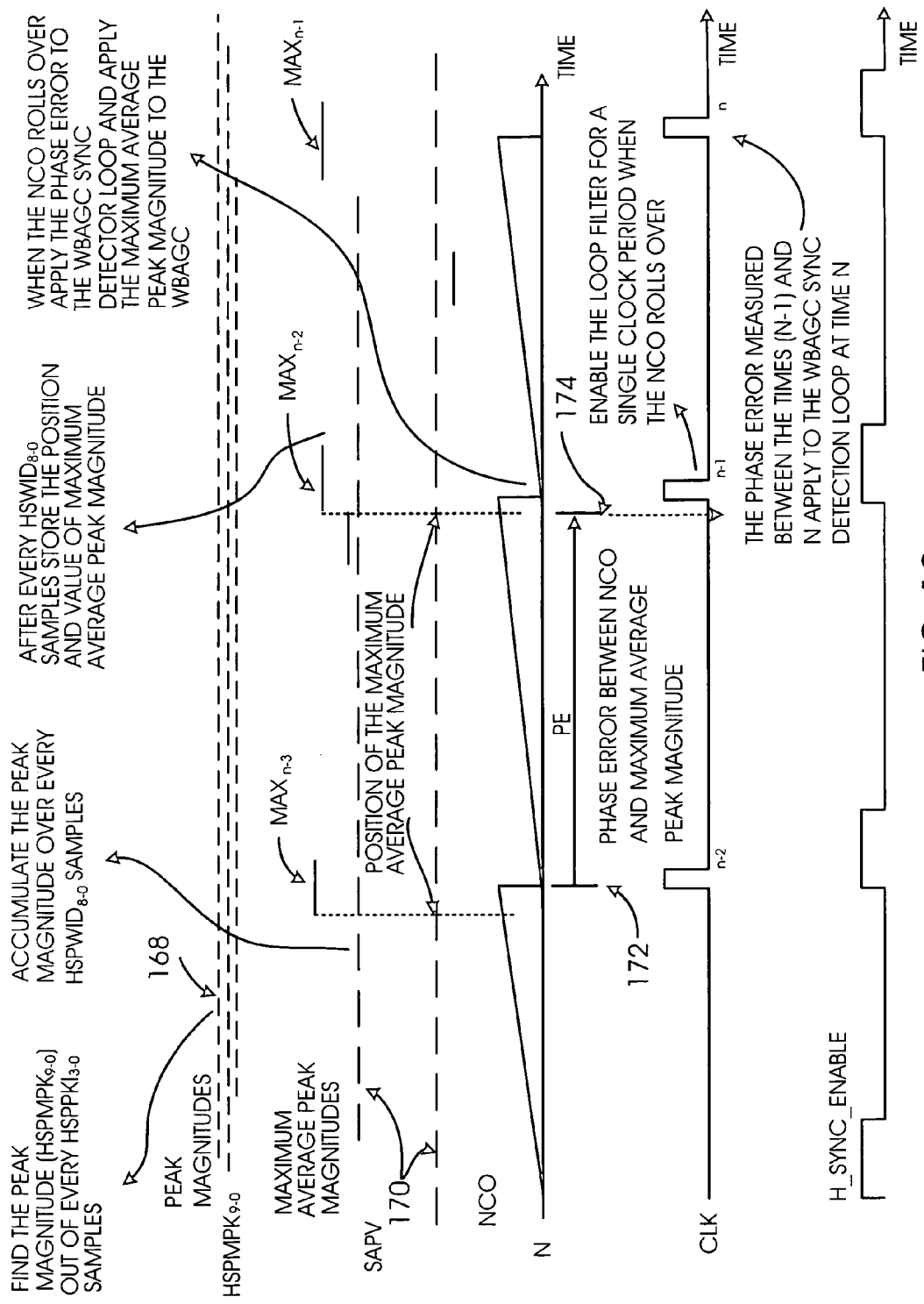
FIG. 10 is a graph of waveforms illustrating an operation of a phase and amplitude detector circuit.

Referring to FIG. 10, a graph of waveforms for several signals illustrating an operation of the phase and amplitude detector circuit 160 are shown. At each cycle of a clock signal (e.g., CLK), the phase and amplitude detector circuit 160 compares a magnitude of the signal DIF to a current peak value (e.g., $HSPMPK_{9\text{-}0}$). The short lines 168 generally illustrate a peak value that is found during $HSPPKI_{3\text{-}0}$ clock samples. If the magnitude of the signal DIF is greater than the current peak value $HSPMPK_{9\text{-}0}$, then the magnitude of the signal DIF may replace the current peak value $HSPMPK_{9\text{-}0}$. Otherwise the current peak value $HSPMPK_{9\text{-}0}$ may not change. In addition, after every predetermined number (e.g., $HSPPKI_{3\text{-}0}$) of clock samples the current peak value $HSPMPK_{9\text{-}0}$ is set equal to zero.

The phase and amplitude detector circuit 160 generally accumulates each current peak value $HSPMPK_{9\text{-}0}$ to estimate an average synchronization level as an accumulated peak value (not shown) The dashed lines 170 generally illustrate a stored accumulated peak value (e.g., SAPV). After each group of samples (e.g., $HSPWID_{8\text{-}0}$) the accumulated peak value may be compared to the stored accumulated peak value SAPV. If the accumulated peak value is greater than the stored accumulated peak value SAPV, the accumulated peak value may replace the stored accumulated peak value SAPV. Otherwise the stored accumulated peak value SAPV may not change.

The phase and amplitude detector circuit 160 may store the position of a maximum accumulated peak value (e.g., MAX) detected in each cycle of the clock signal CLK. The NCO circuit 164 may roll over the signal N at a time 172 starting a clock cycle n−2. The phase and amplitude detector circuit 160 may measure the phase difference between the time 172 and a start time 174 of a maximum accumulated peak value $MAX_{n\text{-}2}$. When the signal N rolls over again at a time 176 the stored accumulated peak value SAPV may be set to zero. Resetting the signal N and the stored accumulated peak value SAPV generally allows a next maximum accumulated peak value $MAX_{n\text{-}1}$ to be found during the next horizontal synchronization period n−1. The phase error measured during the clock cycle n−1 may be applied to the WBAGC circuit 122 during a next clock cycle n as the phase error signal PE. The enable signal H_SYNC_ENABLE may be generated at a start of each cycle of the NCO circuit 164. The enable signal H_SYNC_ENABLE may enable the loop filter circuit 162.

Referring again to FIG. 8, the phase error between the NCO signal N and the horizontal synchronization is generally applied to the loop filter circuit 162. A direct gain path 178 in the loop filter circuit 162 generally measures the instantaneous phase error. An indirect gain path 180 in the loop filter 162 generally measures a frequency error between a nominal frequency (e.g., $\omega c$) of the NCO circuit 164 and the true frequency $\omega c$ of the horizontal synchronization of the analog television signal X. As a closed loop formed around the phase and amplitude detector circuit 160, loop filter circuit 162 and NCO circuit 164 reaches steady state, the phase error signal PE may approach zero and the frequency accumulator 167 in the indirect path 180 may approach a value proportional to the frequency error between the NCO nominal frequency $\hat{\omega}c$ and the frequency $\omega c$ of the horizontal synchronization. A response time of the closed loop is generally controlled by the direct and indirect gains. As the gains increase, the response time of the loop generally decreases. However, large gains may allow more additive noise to pass through the closed loop. The loop filter circuit 162 may be enabled for one clock period by the enable signal H_SYNC_ENABLE beginning when the NCO signal N rolls over.

A general purpose of the NCO circuit 164 is to track the phase and frequency of the horizontal synchronization pulses. A feedback signal (e.g., FB1) generated by the loop filter circuit 162 may be presented to the NCO circuit 164 to adjust a phase offset and a frequency offset of the signal N. The NCO circuit 164 may accumulate modulo $2^{24}$. The NCO circuit 164 generally operates at a nominal frequency of 27 MHz for the PAL system and 54 MHz for the NTSC system.

Referring to FIG. 11, a functional block diagram of the second converter circuit 120 is shown. The second converter circuit 120 generally comprises a translation circuit 178, a decimation circuit 180, a phase detector circuit 182, a loop filter 184, an NCO circuit 186, and a lookup table circuit 188. The phase detector circuit 182, loop filter circuit 184, NCO circuit 186 and lookup table circuit 188 generally form a carrier recovery loop. The lookup table circuit 188 may be implemented to generate two sinusoidal signals 90 degrees out of phase (e.g., sine and cosine) in response to a signal (e.g., N2). The decimation circuit 180 may include one or more decimation filter circuits 189.

In the PAL or NTSC systems, the signal DIF may be multiplied by a sinusoid signal to translate the television signal within the signal DIF to a baseband signal (e.g., Z(n)). To complete a demodulation process, the baseband signal Z(n) may pass through the decimation circuit 180 to suppress double frequency terms. The decimation circuit 180 may present the demodulated digitized television signal DX.

Figure 12:
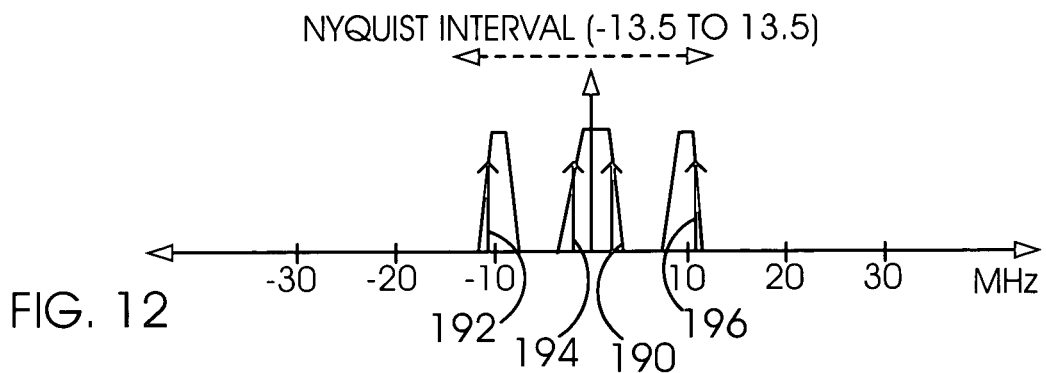
FIG. 12 is a graph of a frequency response of a baseband signal in the PAL system.

Referring to FIG. 12, a graph of a frequency response of the baseband signal Z(n) in the PAL system is shown. The carrier 130B at −9 MHz in FIG. 4 may translate to a baseband frequency 190 in FIG. 12 and the carrier 128B at 9 MHz in FIG. 4 may translate to a carrier 192 in FIG. 12 due to aliasing. Further, the carrier 128B at 9 MHz in FIG. 4 may translate to a negative baseband frequency 194 in FIG. 12 and the carrier 130B in FIG. 4 may translate to a carrier 196 in FIG. 12 due to aliasing.

Figure 13:
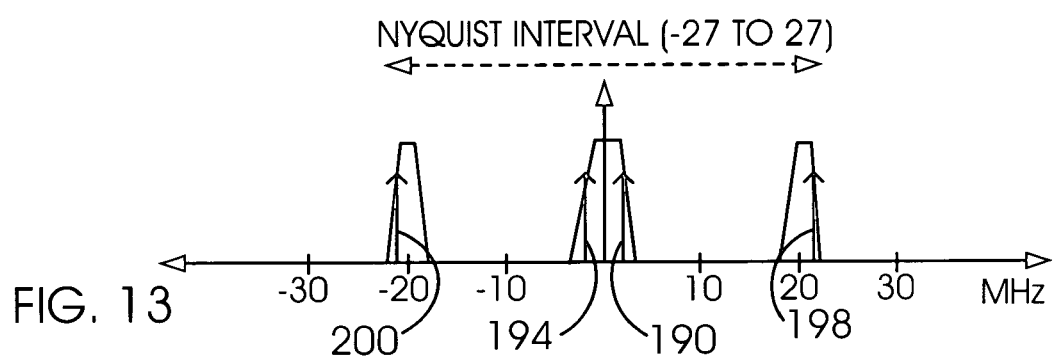
FIG. 13 is a graph of a frequency response of the baseband signal in the NTSC system.

Referring to FIG. 13, a graph of a frequency response of the baseband signal Z(n) in the NTSC system is shown. The carrier 138 at −10 MHz in FIG. 5 may translate to the negative baseband frequency 194 in FIG. 13 and the carrier 136 at 10 MHz in FIG. 5 may translate to a carrier 198 at 20 MHz in FIG. 13. In addition, the carrier 138 at −10 MHz in FIG. 5 may translate to a carrier 200 at −20 MHz in FIG. 13 and the carrier 136 at 10 MHz in FIG. 5 may translate to the positive baseband frequency 190 in FIG. 13 due to aliasing.

Figure 14:
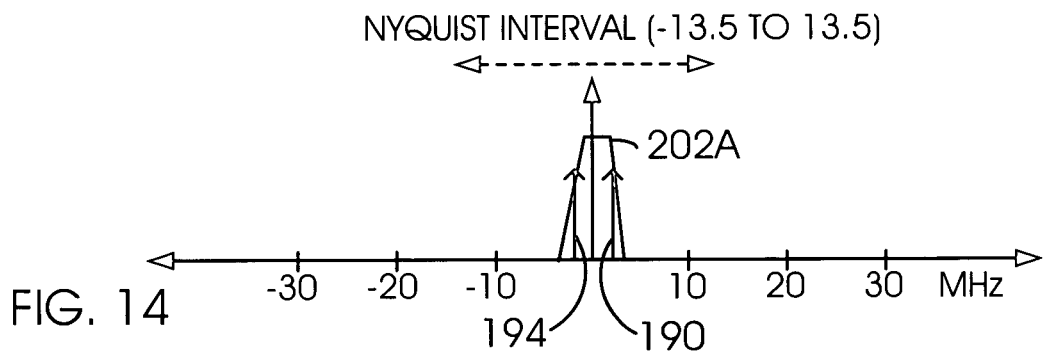
FIG. 14 is a graph of a frequency response of the digital television signal in the PAL system.
Figure 15:
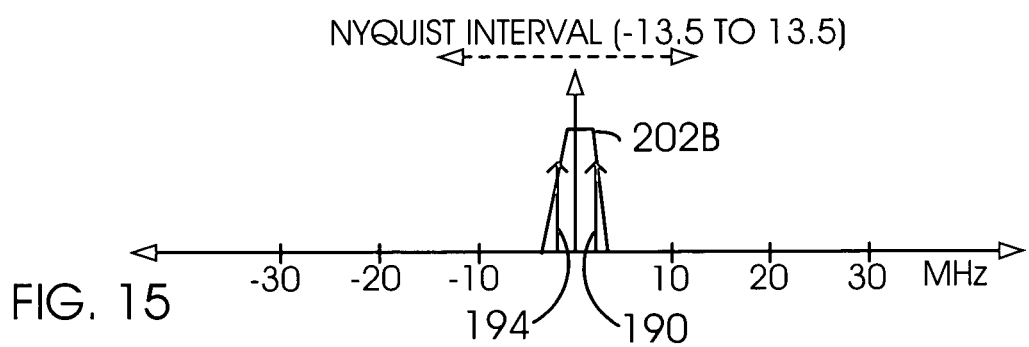
FIG. 15 is a graph of a frequency response of the digital television signal in the NTSC system.

Referring to FIGS. 14 and 15, graphs of a frequency response of the digital television signal DX are shown. In the PAL and NTSC systems, the decimation circuit 180 generally suppresses high-frequency signal components. Resulting frequency responses 202A–B for the digital television signal DX are shown in FIG. 14 for the PAL system and FIG. 15 for the NTSC system, respectively. In both the PAL and the NTSC systems, the sample rate may equal 13.5 MHz at the output 106 of the decimation circuit 180.

The IF frequency to the baseband frequency translation process may described mathematically as follows. First, the signal DIF presented from the A/D converter circuit 118 may be multiplied by a cosine reference signal (e.g., $\cos(\hat{\omega}_c n+\theta)$). The cosine reference signal may be read from a read only memory (not shown) within the lookup table circuit 188. The variable n may be the clock index at the output of the A/D converter circuit 118. The signal Z(n) produced by the multiplication may be defined by equation 5 as follows:

$$Z(n)=DIF(n)\cos(\hat{\omega}_c n+\theta) \qquad \text{Eq. (5)}$$

Substituting the formula for DIF(n) from equation 3 produces equation 6 as follows:

$$Z(n) = X(n)\cos(\omega c n)\cos(\hat{\omega} c n + \theta) \qquad \text{Eq. (6)}$$
$$= \frac{X(n)}{2}(\cos((\hat{\omega}c + \omega c)n + \theta) + \cos((\hat{\omega}c - \omega c)n + \theta))$$

Figure 16:
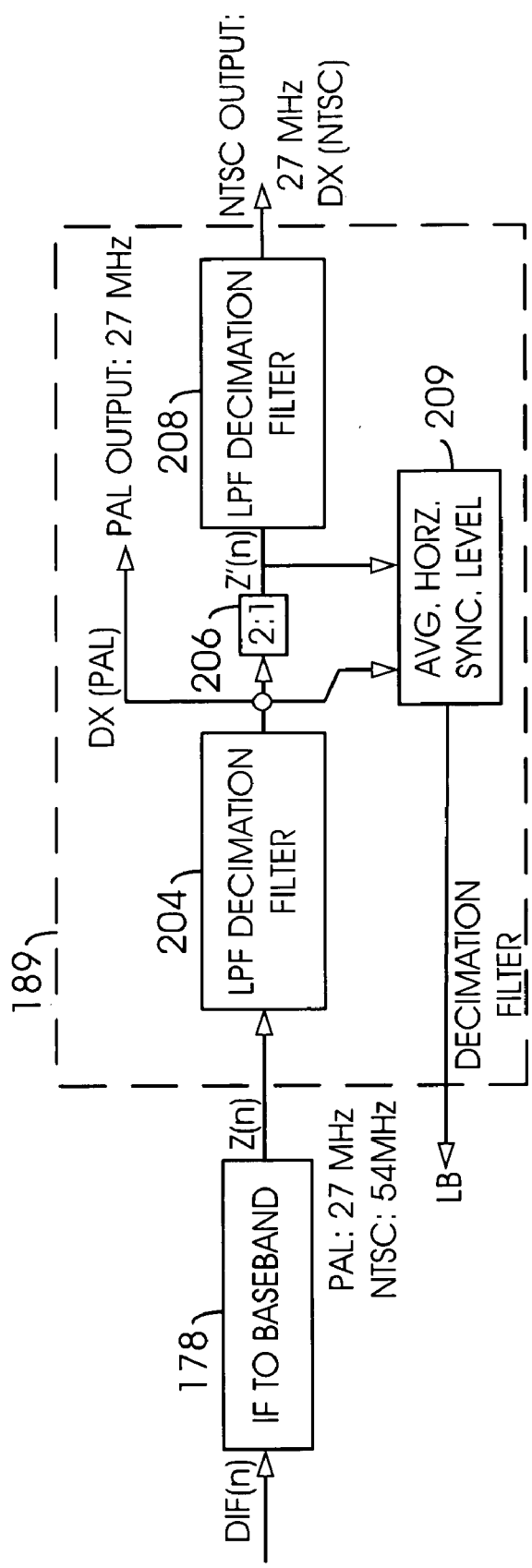
FIG. 16 is a block diagram of a decimation filter circuit.

Referring to FIG. 16, a block diagram of the decimation filter circuit 189 is shown. The decimation filter circuit 189 generally comprises a first decimation filter circuit 204, a decimation module circuit 206, a second decimation filter circuit 208, and an average horizontal synchronization level circuit 209. The first decimation filter circuit 204 may be implemented as a low pass filter (LPF) decimation filter circuit. The second decimation filter circuit 208 may also be implemented as an LPF decimation filter. The decimation module circuit 206 may be implemented as a 2-to-1 decimation module circuit.

The first LPF decimation filter circuit 204 may suppress noise located above ¼ of the sampling rate. In the PAL system, the signal Z(n) may pass only through the first LPF decimation filter circuit 204 and is then presented as the digital television signal DX. In the NTSC system, the signal Z(n) may passes through the first LPF decimation filter circuit 204, the 2:1 decimation module circuit 206 and the second LPF decimation filter circuit 208 from which the digital television signal DX is presented. The 2:1 decimation module circuit 206 generally reduces the sampling rate by a factor of two. After carrier recovery lock and WBAGC horizontal synchronization lock, the signal presented by the LPF decimation filter 204 may be applied to the average horizontal synchronization level circuit 209. The average horizontal synchronization level circuit 209 may generate the average level signal LB which may be presented back to the compare circuit 142 (FIG. 6).

Figure 17:
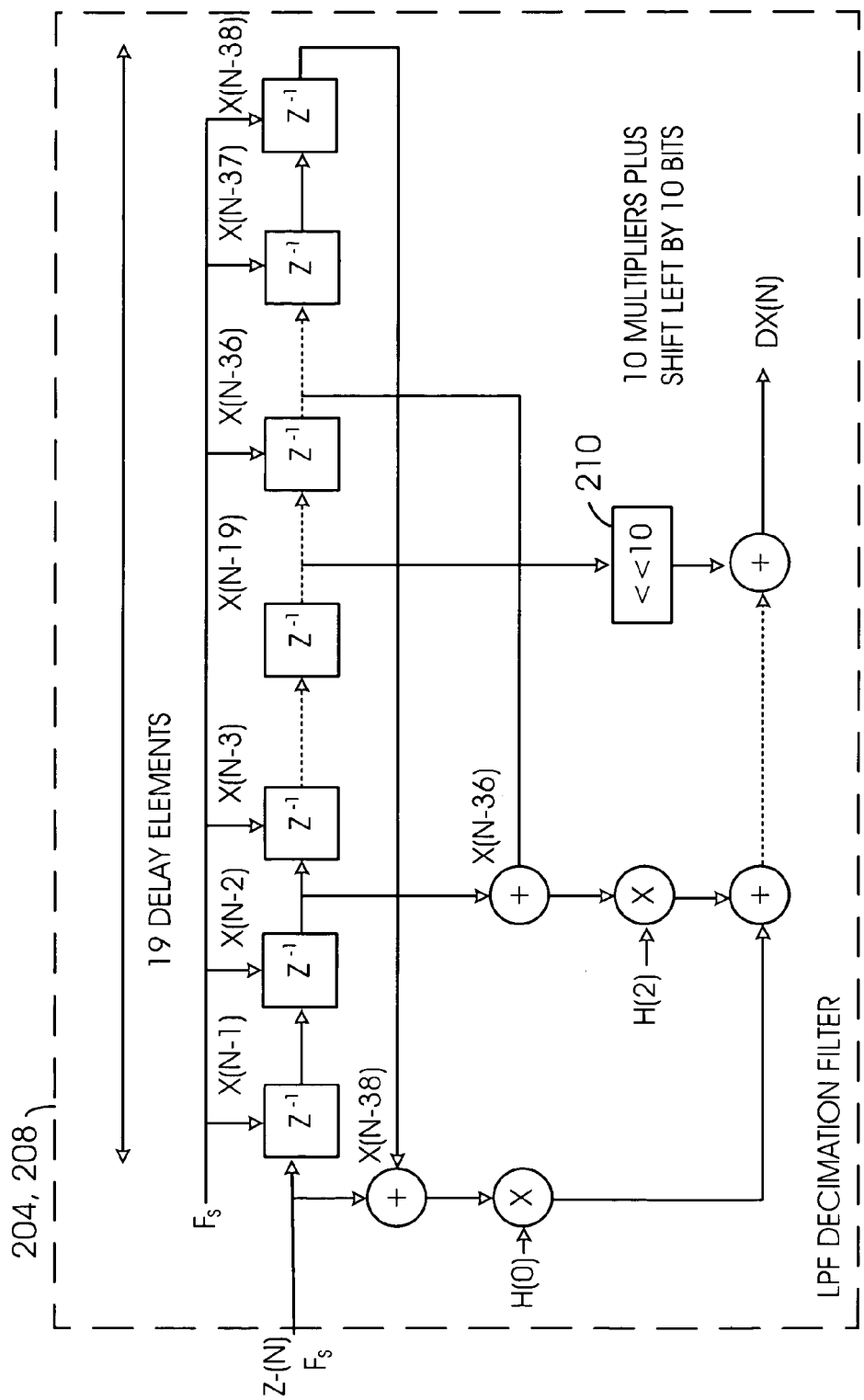
FIG. 17 is a functional block diagram of a loop filter decimation filter circuit.

Referring to FIG. 17, a functional block diagram of each LPF decimation filter circuit 204 and 208 is shown. Each odd-indexed coefficient of the LPF decimation filters may be zero except for a coefficient at index 19 that may have a predetermined value of 1024. Multiplication by the coefficient at index 19 is generally illustrated by a 10-bit shift left operator 210. An impulse response of the LPF decimation filters may be symmetric, and therefore, even-indexed coefficients may be shared. Ten (10) pairs of taps may be added before multiplying the shared coefficients.

At an input clock rate (e.g., Fs), an input switch generally alternates between each subfilter. As each input applies to a subfilter, the subfilters may shift the delay elements and performs the multiplications and additions. First, an input signal may applied to a lower subfilter and an output signal from the subfilter may be calculated. A next input signal may then be applied to an upper subfilter and an output signal may be computed and added to the output signal of the lower subfilter computed at the previous clock. A resulting sum generally produces an output signal of the decimation filter circuit. Each set of two inputs into the decimation filter circuit generally generated a new output from the decimation filter circuit. Therefore, each subfilter may operate at ½ of an input clock rate. In the first decimation filter circuit 204 each subfilter may be divided by the value of 1024 and in the second decimation filter circuit 208 each subfilter may be divided by a value of 2048. Therefore, a DC gain of the first decimation filter circuit 204 is generally twice the DC gain of the second decimation filter circuit 208. The larger DC gain of the first decimation filter circuit 204 may account for the factor of two that divides the analog television signal X(n) in equation 6.

Figure 18:
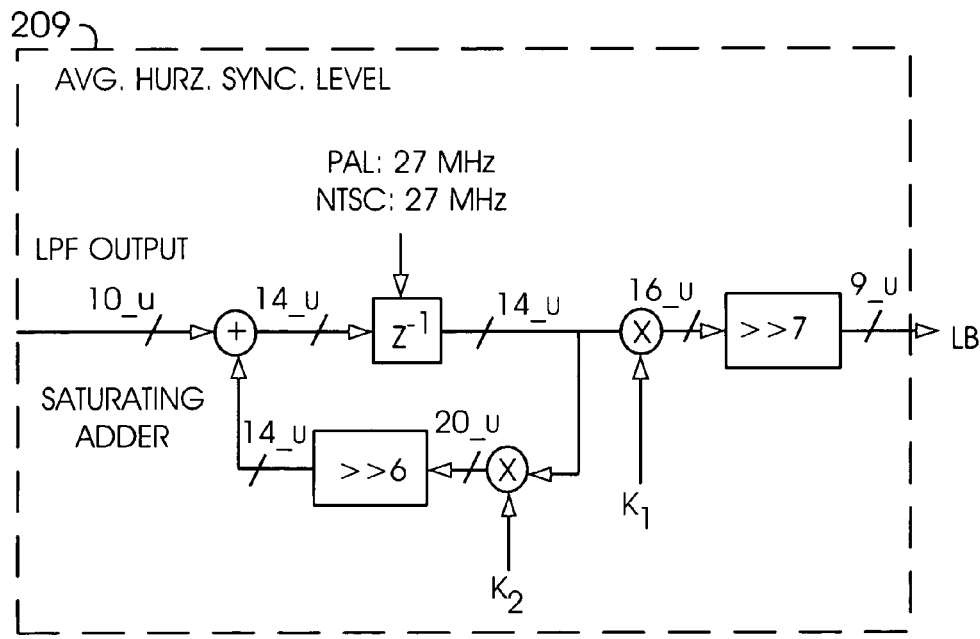
FIG. 18 is a functional block diagram of an average horizontal synchronization level circuit.

Referring to FIG. 18, a functional block diagram of the average horizontal synchronization level circuit 209 is shown. In the NTSC system, the signal presented by the LPF decimation filter circuit 204 may be down sampled by a factor of two by the 2:1 decimation module circuit 206 before being applied to the average horizontal synchronization level circuit 209. In the PAL system, however, the signal presented by the LPF decimation filter 204 may be applied directly to the average horizontal synchronization level circuit 209. Therefore, the average horizontal synchronization level circuit 209 generally operates at 27 MHz. In the NTSC and the PAL systems the constant $K_1$ may have a value equal to 6, and the constant $K_2$ may have a value equal to 58.

The 2:1 decimation module circuit 106 generally removes signal components located at twice the carrier frequency and reduces the sample rate to the pixel clock rate of 13.5 MHz Therefore, a signal (e.g., Z') generated by the 2:1 decimation module circuit 206 may be expressed as shown in equation 7 as follows:

$$Z'(m) = \frac{X(m)}{2}(\cos((\hat{\omega}c - \omega c)m + \theta)) \qquad \text{Eq. (7)}$$

The variable m may be the index of the pixel clock at 13.5 MHz.

When the carrier recovery process achieves frequency and phase lock then the estimated frequency $\hat{\omega}_c$ may equal the carrier frequency $\omega_c$. Further, the phase error $\theta$ between modulated carrier signal Y in equation 1 and the baseband signal Z(n) in equation 5 may go to zero. With $\hat{\omega}_c=\omega_c$ and $\theta=0$, then equation 7 may be reduced to equation 8 as follows:

$$Z'(m) = \frac{X(m)}{2} \qquad \text{Eq. (8)}$$

Therefore, the signal Z'(m) presented by the 2:1 decimation module circuit 206 may be approximately directly proportional to the television signal X in digital form.

Referring to FIG. 11, the phase detector circuit 182 generally measures the difference in phase (e.g., P(n)) between the modulated carrier signal DIF(n) presented by the A/D converter circuit 118 and the cosine carrier in the IF to baseband translation circuit 178. First, the phase detector circuit 182 may multiply the modulated carrier signal DIF(n)

by the sine reference signal from the lookup table circuit 188 as shown in equation 9 as follows:

$$P(n) = X(n)\cos(\hat{\omega}cn)\sin(\hat{\omega}cn + \theta) \qquad \text{Eq. (9)}$$

$$= \frac{X(n)}{2}(\sin((\hat{\omega}c + \omega c)n + \theta) + \sin((\hat{\omega}c - \omega c)n + \theta))$$

The variable $\hat{\omega}c$ may be an estimate of the input carrier frequency $\omega c$ and $\theta$ may be the phase error between the modulated carrier signal DIF(n) presented by the A/D converter circuit 118 and the cosine carrier in the IF to baseband translation circuit 178. The cosine and sine reference signals from the lookup table circuit 188 may be evaluated with the same frequency and phase. A low pass filter circuit 210 within the phase detector circuit 182 may suppress high-frequency components of the error signal P(n), and therefore an error signal (e.g., PE2) presented by the low pass filter circuit 210 may be defined in equation 10 as follows:

$$PE2(n) \approx \frac{X(n)}{2}\sin((\hat{\omega}c - \omega c)n + \theta) \qquad \text{Eq. (10)}$$

As the carrier recovery loop achieves frequency lock, the frequency error generally goes to zero, and thus equation 10 may be reduced to equation 11 as follows:

$$PE2 \approx \frac{X(n)}{2}\sin(\theta) \qquad \text{Eq. (11)}$$

For a small phase error, equation 11 may be reduced to equation 12 as follows:

$$PE2 \approx \frac{X(n)}{2}\theta \qquad \text{Eq. (12)}$$

Figure 19:
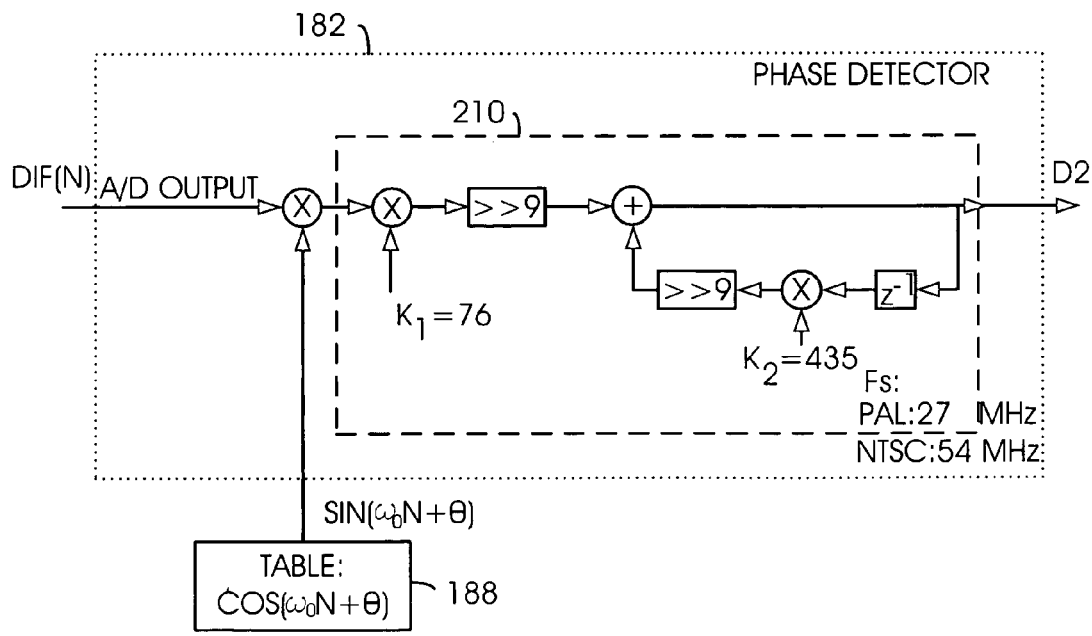
FIG. 19 is a functional block diagram for a phase detector circuit.

Referring to FIG. 19, a functional block diagram for the phase detector circuit 182 is shown. The phase detector circuit 182 generally multiplies the signal DIF(n) presented by the A/D converter circuit 118 by the sinusoid reference signal from the lookup table circuit 188. A phase input to the lookup table circuit 188 may be calculated from the carrier recovery loop. The low pass filter 210 generally suppress signal components located at a sum of the carrier frequency $\omega_c$ and the estimate of the carrier frequency $\hat{\omega}_c$. The low pass filter circuit 210 generally comprises a single zero and a single pole. The pole position may controlled by a constant $K_2$ and multiplication by a gain $K_1$ gives a DC gain equal to one (1). The constant $K_1$ may have a value equal to 76 and the constant $K_2$ may have a value equal to 435.

Referring again to FIG. 11, the loop filter circuit 184 generally estimates a phase and a frequency offset in the signal DIF(n) relative to a nominal frequency of the NCO circuit 186. As the carrier recovery loop locks to the carrier within the signal DIF(n), the phase error signal PE2 may approach zero, causing a direct path 212 through the loop filter circuit 184 to approach zero. In addition, a frequency accumulator circuit 214 in an indirect path 216 through the loop filter circuit 184 may converge to a steady-state value proportional to the frequency offset. The frequency offset may be a difference in frequency between the input carrier frequency $\omega_c$ and the nominal frequency $\hat{\omega}_c$ applied to the carrier recovery loop. A direct gain and an indirect gain of the loop filter circuit 184 generally controls a time response of the carrier recovery loop. A loop filter adder 218 may saturate to a 21-bit signed value in generating a feedback signal (e.g., FB2).

In an acquisition mode, the loop filter circuit 184 may operate at a frequency of 54 MHz for the NTSC system and a frequency of 27 MHz for the PAL system. In a tracking mode, the loop filter circuit 184 may operate at the horizontal synchronization pulse rate of 15.75 KHz. A register following the loop filer circuit 184 generally updates at the loop filter rate.

As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a tuner circuit configured to generate an intermediate frequency signal having a carrier signal at a first intermediate frequency in response to a first frequency conversion applied to a radio-frequency signal modulated by an analog television signal;
   an analog-to-digital circuit configured to generate a digital intermediate signal having said carrier signal at a second intermediate frequency in response to a digitization of said intermediate frequency signal, wherein said second intermediate frequency is above a baseband frequency;
   a converter circuit configured to generate a digital television signal representative of said analog television signal at said baseband frequency in response to a demodulation of said digital intermediate signal;
   a detector circuit configured to generate a level signal in response to an average level of a horizontal synchronization pulse within said digital intermediate signal.

2. The apparatus according to claim 1, wherein said converter circuit further comprises:
   a translation circuit configured to generate a digital baseband signal in response to a multiplication of said digital intermediate signal by a single sinusoid signal; and
   a decimation circuit configured to generate said digital television signal in response to a decimation of said digital baseband signal.

3. The apparatus according to claim 2, wherein said decimation circuit comprises a decimation filter configured to decimation filter said digital baseband signal.

4. The apparatus according to claim 1, wherein said converter circuit comprises:
   a first decimation filter configured to generate a first signal in response to said digital intermediate signal;
   a circuit configured to generate a second signal in response to an image scaling of said first signal by a predetermined ratio; and
   a second decimation filter configured to generate said digital television signal in response to said second signal.

5. The apparatus according to claim 1, further comprising:
   a decimation circuit configured to generate a second level signal in response to a second average level of a second horizontal synchronization pulse within said digital television signal; and a control circuit configured to generate a feedback signal in response to said signal level said second level signal.

6. The apparatus according to claim 1, wherein said analog-to-digital circuit is further configure to generate a saturation signal in response to a digital conversion saturation while generating said digital intermediate signal, said apparatus further comprising a control circuit configured to adjust a feedback signal in response to said saturation signal.

7. The apparatus according to claim 1, wherein said converter circuit comprises:
a phase detector circuit configured to generate an error signal in response to a detection of both a phase error and a frequency error of said digital intermediate signal relative to a sinusoid signal;
a filter circuit configured to generate a feedback signal in response to said error signal;
an oscillator circuit configured to generate a sawtooth signal in response to said feedback signal; and
a lookup table circuit configured to generate a single sinusoid signal in response to a table look-up conversion of said sawtooth signal.

8. The apparatus according to claim 1, further comprising a tracking detector circuit configured to generate an enable signal in response to a tracking of a horizontal synchronization signal within said digital intermediate signal, wherein said converter circuit includes a filter circuit configured to generate a feedback signal in response to said enable signal.

9. A method of demodulating a radio-frequency signal modulated by an analog television signal, the method comprising the steps of:
(A) generating an intermediate frequency signal having a carrier signal at a first intermediate frequency in response to a first frequency conversion applied to said radio-frequency signal;
(B) generating a digital intermediate signal having said carrier signal at a second intermediate frequency in response to a digitization of said intermediate frequency signal, wherein said second intermediate frequency is above a baseband frequency; and
(C) generating a digital television signal representative of said analog television signal at said baseband frequency in response to demodulating said digital intermediate signal;
(D) generating a level signal in response to an average level of a horizontal synchronization pulse within said digital intermediate signal.

10. The method according to claim 9, wherein step (C) comprises the sub-steps of:
generating a digital baseband signal in response to a multiplication of said digital intermediate signal by a single sinusoid signal; and
generating said digital television signal in response to a decimation of said digital baseband signal.

11. The method according to claim 10, wherein generating said digital television signal comprises the sub-step of decimation filtering said digital baseband signal.

12. The method according to claim 10, wherein generating said digital television signal comprises the sub-step of:
generating a first signal in response to a first decimation filtering applied to said digital baseband signal.

13. The method according to claim 9, further comprising the steps of:
generating a second level signal in response to a second average level of a second horizontal synchronization pulse within said digital television signal;
generating a feedback signal in response to said second level signal; and
adjusting an amplitude of said intermediate signal in response to said feedback signal to maintain said second average level proximate a predetermined threshold.

14. The method according to claim 9, further comprising the steps of:
generating a saturation signal in response to a digital conversion saturation while generating said digital intermediate signal; and
adjusting a feedback signal in response to said saturation signal.

15. The method according to claim 9, further comprising the steps of:
generating an error signal in response to a detection of both a phase error and a frequency error of said digital intermediate signal relative to a sinusoid signal;
generating a feedback signal in response to said error signal;
generating a sawtooth signal in response to said feedback signal; and
generating a single sinusoid signal in response to a table look-up conversion of said sawtooth signal.

16. The method according to claim 9, further comprising the steps of:
generating an enable signal in response to a tracking of a horizontal synchronization signal within said digital intermediate signal; and
generating a feedback signal in response to said enable signal.

17. An apparatus comprising:
means for generating an intermediate frequency signal having a carrier signal at a first intermediate frequency in response to a first frequency conversion applied to a radio-frequency signal modulated by an analog television signal;
means for generating a digital intermediate signal having said carrier signal at a second intermediate frequency in response to a digitization of said intermediate frequency signal, wherein said second intermediate frequency is above a baseband frequency;
means for generating a digital television signal representative of said analog television signal at said baseband frequency in response to demodulating said digital intermediate signal;
means for generating a level signal in response to an average level of a horizontal synchronization pulse within said digital intermediate signal.

18. The method according to claim 12, wherein generating said digital television signal further comprises the sub-step of:
generating a second signal in response to an image scaling of said first signal by a predetermined ratio.

19. The method according to claim 18, wherein generating said digital television signal further comprises the sub-step of:
generating said digital television signal in response to a second decimation filtering applied to said second signal.

20. The method according to claim 9, further comprising the step of:
generating a feedback signal in response to said level signal.

21. The method according to claim 20, further comprising the step of:
adjusting an amplitude of said intermediate signal in response to said feedback signal to maintain said average level proximate a predetermined threshold.

* * * * *